(12) United States Patent
Ziegler (10) Patent No.: US 11,444,226 B2
(45) Date of Patent: Sep. 13, 2022

(54) OPTOELECTRONIC DEVICE WITH A COMPONENT WHICH IS SURFACE-MOUNTED ON A FRAME SUPPORT STRUCTURE, AND REFLECTIVE COMPOSITE MATERIAL FOR SUCH A DEVICE

(71) Applicant: ALANOD GMBH & CO. KG, Ennepetal (DE)

(72) Inventor: Stefan Ziegler, Sprockhovel (DE)

(73) Assignee: Alanod GmbH & Co. KG, Ennepetal (DE)

( * ) Notice: Subject to any disclaimer, the term of this patent is extended or adjusted under 35 U.S.C. 154(b) by 307 days.

(21) Appl. No.: 16/629,846

(22) PCT Filed: Dec. 8, 2017

(86) PCT No.: PCT/EP2017/081991
§ 371 (c)(1),
(2) Date: Jan. 9, 2020

(87) PCT Pub. No.: WO2019/011456
PCT Pub. Date: Jan. 17, 2019

(65) Prior Publication Data
US 2021/0367111 A1 Nov. 25, 2021

(30) Foreign Application Priority Data

Jul. 13, 2017 (DE) .................... 10 2017 115 798.0
Oct. 12, 2017 (EP) .................... 17196142

(51) Int. Cl.
*H01L 33/60* (2010.01)
*H01L 33/48* (2010.01)
(Continued)

(52) U.S. Cl.
CPC ............ *H01L 33/60* (2013.01); *H01L 33/486* (2013.01); *H01L 33/62* (2013.01)

(58) Field of Classification Search
CPC ....... H01L 33/60; H01L 33/486; H01L 33/62; H01L 24/73
See application file for complete search history.

(56) References Cited

U.S. PATENT DOCUMENTS 5,040,868 A 8/1991 Waitl et al.
6,407,411 B1 6/2002 Wojnarowski et al.
(Continued)

FOREIGN PATENT DOCUMENTS

DE 298 12 559 U1 12/1999
DE 10 126 100 A1 12/2002
(Continued)

OTHER PUBLICATIONS

Nakano, Hiromi, et al., "Microstructure of Interfacial Region Between Cold-Sprayed Copper Coating and AlN Substrate Coated With Sputtered Titanium and Copper" Journal of Thermal Spray Technology, vol. 20, No. 3, Jun. 24, 2010 (Jun. 24, 2010), pp. 407-411, XP055160385, ISSN: 1059-9630, DOI: 10.1007/s11666-010-9522-z; abstract; Figure 2.
(Continued)

*Primary Examiner* — Nelson Garces
*Assistant Examiner* — Antonio B Crite
(74) *Attorney, Agent, or Firm* — Dickinson Wright PLLC (57) ABSTRACT

An optoelectronic device (LV) with a reflective composite material (V) having a carrier (1) consisting of aluminium, having an interlayer (2) composed of aluminium oxide present on one side (A) of the carrier (1) and having a reflection-boosting optically active multilayer system (3) that has been applied via the interlayer (2). The interlayer (2) consisting of aluminium oxide has a thickness ($D_2$) in the
(Continued)

range from 5 nm to 200 nm and that, on the opposite side (B) of the carrier (1) from the reflection-boosting optically active multilayer system (3), a superficial layer (9) of a metal or metal alloy having, at 25° C., a specific electrical resistivity of not more than $1.2*10^{-1}$ $\Omega mm^2/m$ has been applied. The thickness ($D_9$) of the superficially applied layer (9) is in the range from 10 nm to 5.0 μm. For an optoelectronic device (LV), the leadframe (LF) has a metallic material with an aluminium carrier (1), on the surface (A) of which a metallic joining layer (FA) not consisting of aluminium has been applied locally at the bonding site (SP) of an electronic surface-mounted device (SMD) to a wire (D).

29 Claims, 3 Drawing Sheets (51) Int. Cl.
| | |
|---|---|
| H01L 33/62 | (2010.01) |
| H01L 23/00 | (2006.01) |
| H05K 1/02 | (2006.01) |
| H05K 3/20 | (2006.01) |
| H05K 3/32 | (2006.01) |
| H05K 1/11 | (2006.01) |
| G02B 5/08 | (2006.01) |
| C23C 4/06 | (2016.01) |

(56) References Cited

U.S. PATENT DOCUMENTS

| | | |
|---|---|---|
| 6,848,797 B1 | 2/2005 | Gillich et al. |
| 7,141,422 B2 | 11/2006 | Sano |
| 7,143,967 B2 | 12/2006 | Heinrich et al. |
| 7,714,341 B2 | 5/2010 | Keun et al. |
| 8,783,914 B2 | 7/2014 | Sanpei et al. |
| 9,022,613 B2 | 5/2015 | Komatsubara et al. |
| 9,130,140 B2 | 9/2015 | Tsuchiya et al. |
| 9,263,315 B2 | 2/2016 | Oda et al. |
| 9,484,515 B2 | 11/2016 | Komatsubara et al. |
| 9,620,684 B2 | 4/2017 | Katoh et al. |
| 9,685,594 B2 | 6/2017 | Urano |
| 9,691,959 B2 | 6/2017 | Dijkstra et al. |
| 9,859,482 B2 | 1/2018 | Katoh et al. |
| 9,887,331 B2 | 2/2018 | Oda et al. |
| 9,966,517 B2 | 5/2018 | Oda et al. |
| 10,411,457 B2 | 9/2019 | Fischer et al. |
| 10,486,336 B2 | 11/2019 | Yilmaz |
| 2004/0046178 A1 | 3/2004 | Sano |
| 2004/0166247 A1 | 8/2004 | Heinrich et al. |
| 2006/0040416 A1 | 2/2006 | Sano |
| 2008/0006837 A1 | 1/2008 | Keun et al. |
| 2011/0095310 A1 | 4/2011 | Komatsubara et al. |
| 2012/0014110 A1 | 1/2012 | Sanpei et al. |
| 2012/0313131 A1 | 12/2012 | Oda et al. |
| 2013/0105849 A1 | 5/2013 | Komatsubara et al. |
| 2014/0284651 A1 | 9/2014 | Tsuchiya et al. |
| 2014/0319552 A1 | 10/2014 | Komatsubara et al. |
| 2015/0077982 A1 | 3/2015 | Urano |
| 2015/0137149 A1 | 5/2015 | Urano |
| 2015/0311403 A1 | 10/2015 | Katoh et al. |
| 2015/0325763 A1 | 11/2015 | Oda et al. |
| 2016/0099395 A1 | 4/2016 | Oda et al. |
| 2016/0315237 A1 | 10/2016 | Dijkstra et al. |
| 2016/0354950 A1 | 12/2016 | Yilmaz |
| 2017/0179357 A1 | 6/2017 | Katoh et al. |
| 2017/0191154 A1 | 7/2017 | Toshimori et al. |
| 2017/0288109 A1 | 10/2017 | Dijkstra et al. |
| 2018/0034260 A1 | 2/2018 | Fischer et al. |
| 2018/0050382 A1 | 2/2018 | Scobel |
| 2018/0132475 A1 | 5/2018 | Bittlinger et al. |
| 2018/0239067 A1 | 8/2018 | Templin et al. |
| 2018/0246261 A1 | 8/2018 | Templin et al. |
| 2018/0291208 A1 | 10/2018 | Kupfer et al. |

FOREIGN PATENT DOCUMENTS

| | | | |
|---|---|---|---|
| DE | 103 40 005 A1 | 3/2004 | |
| DE | 202011050976 | * 11/2012 | |
| DE | 20 2011 050 976 U1 | 1/2013 | |
| DE | 10 2012 108 719 A1 | 3/2014 | |
| DE | 10 2015 211 843 A1 | 12/2016 | |
| DE | 102015211843 A1 * | 12/2016 | ......... H01L 23/3677 |
| DE | 10 2015 114 094 A1 | 3/2017 | |
| DE | 10 2015 114 095 A1 | 3/2017 | |
| EP | 1 022 787 B1 | 5/2003 | |
| EP | 1 876 653 A2 | 1/2008 | |
| EP | 2 138 761 A1 | 12/2009 | |
| EP | 2 416 389 A1 | 2/2012 | |
| EP | 2416389 A1 * | 2/2012 | ............. H01L 33/60 |
| EP | 2779257 A2 * | 9/2014 | ............. H01L 33/52 |
| EP | 2 819 185 A1 | 12/2014 | |
| EP | 3 196 334 A1 | 7/2017 | |
| EP | 3 428 696 A1 | 1/2019 | |
| WO | WO 2000/029784 A1 | 5/2000 | |
| WO | WO 2017/032809 A1 | 3/2017 | |

OTHER PUBLICATIONS

Ho, C.Y., et al., "Electrical Resistivity of Ten Selected Binary Alloy Systems", J. Phys. Chem. Ref. Data, vol. 12, No. 2, 1983, pp. 183-322.

International Search Report of PCT/EP2017/081991 dated Mar. 14, 2018.

U.S. Appl. No. 10/475,973 (B2), filed Nov. 12, 2019, Dijkstra, Paul, et al.

* cited by examiner

OPTOELECTRONIC DEVICE WITH A COMPONENT WHICH IS SURFACE-MOUNTED ON A FRAME SUPPORT STRUCTURE, AND REFLECTIVE COMPOSITE MATERIAL FOR SUCH A DEVICE

CROSS-REFERENCE TO RELATED APPLICATIONS

This application is a 35 U.S.C. § 371 national phase of PCT International Application No. PCT/EP2017/081991, filed Dec. 8, 2017, which claims the benefit of priority under 35 U.S.C. § 119 to German Patent Application No. 10 2017 115 798.0, filed Jul. 13, 2017, and European Patent Application No. 17196142.8, filed Oct. 12, 2017, the contents of which are incorporated herein by reference in their entirety.

FIELD OF THE INVENTION

The present invention relates to an optoelectronic device comprising a leadframe for a surface-mountable electronic component, wherein the leadframe comprises a metallic material, and wherein the electronic component lies and has been mounted on the top side of the leadframe and has been electrically contacted to the leadframe by means of a wire.

The optoelectronic device may in particular be a light-emitting device, wherein the metallic material has preferably been formed from a reflective composite material having an aluminium carrier and the electronic component is a light-emitting diode (LED) in the form of a chip.

The invention further relates to a reflective composite material for such a device.

BACKGROUND

DE 103 40 005 A1 describes a light-emitting device for emission of white light, which comprises an otherwise unspecified electrically insulating substrate having two connection electrodes provided at the upper surface and on the bottom side of the substrate. The known device comprises a light-emitting diode (LED) in the form of a chip positioned atop the substrate. The cathode of this light-emitting diode is connected to one of the electrodes by a bonding means, and the anode is connected to the other electrode by means of a bonding wire. The LED and the upper surface of the substrate are covered by a transparent resin.

A characteristic feature of the manner of mounting practiced in DE 103 40 005 A1 is what is called the surface mounting of the LED chip which is also referred to as "die". This mounting technique is referred to as surface-mounting technology, ("SMT"). The abbreviation "SMD" (surface-mounted device) which is also likewise used in this connection describes the surface-mounted component which; by contrast with components having conventional mounting by through-hole technology ("THT") with "wired components"; does not have any wire connections, but is mounted directly on a printed circuit board in the form of what is called a flat assembly by means of solderable connection areas in particular (but here in DE 103 40 005 A1 with an adhesive).

For the connecting electrode structures or leadframes mentioned at the outset, the English term "leadframe" is also customary, in which regard reference is made by way of example to U.S. Pat. No. 6,407,411 B1. In this connection, it should be mentioned that, in the field of SMD-LEDs, the material typically used for the leadframes is nowadays copper, especially rolled copper in a thickness 0.2 mm-0.3 mm. The entire surface of the copper strips is electroplated with silver after the leadframes have been die-cut, but as a result of this it disadvantageously has low stability to hydrogen sulfide and a reflectivity in the order of magnitude of only about 93%.

SMD-LEDs as a mounting base are thus known to have the aforementioned leadframe. The LED chips are secured thereon. These are electrically connected to the leadframe by small wires. Owing to its chemical stability and ductility, gold in particular is used here. In standard practice, wires are especially connected to the leadframe using ultrasound welding.

The manner of mounting described in DE 103 40 005 A1 is also the application of what is called "COB technology" (chip-on-board technology), which is also referred to as bare chip mounting. This is a technology for direct mounting of unencapsulated semiconductor chips on circuit boards for production of electronic assemblies. Nowadays, the term "COB" is used for all assemblies that include the bare semiconductor, whereas this was originally understood to mean exclusively assemblies manufactured by the chip-and-wire technique. The application is based on the newer, wider understanding, including the chip-and-wire technique as envisaged by DE 103 40 005 A1 for the LED chip.

An optoelectronic device of the type specified at the outset is known from EP 1 022 787 B1. The document describes a method of producing a surface-mountable opto-electronic component in which an optical transmitter and/or receiver is applied to a leadframe having electrical connections, in which, before or after the application of the optical transmitter and/or receiver, the leadframe is coated with plastic by insert moulding, so as to produce a base structure having a recess in which the optical transmitter and/or receiver is disposed, with subsequent casting of the recess in the base structure with casting resin. The base structure contains the optical transmitter and/or receiver, and it is stated in this regard that it is advantageous in the case of optical transmitters to mount the semiconductor components in a reflector. This reflector may be formed either as an embossment in a metal carrier or by encasement with a reflective, optionally highly reflective, plastic. A combination of embossment in a metal carrier and encasement with a reflective plastic is likewise possible.

A significant advantage of LED devices is their high luminous efficacy. Luminous efficacy is understood to mean the quotient of the luminous flux $\phi_v$ emitted by a light source and the power P consumed thereby. The SI unit for luminous efficacy is lumens per watt (lm/W). The greater the value of the luminous efficacy, the greater is the luminous flux utilizable to the eye for a given power consumption P of the lamp. The luminous efficacy $\eta_v$ of a lamp is composed of two factors: the radiant efficacy $\eta_e$ of the lamp and the photometric radiation equivalent K of the radiation emitted:

$$\eta_v = \eta_e \cdot K.$$

While the luminous efficacy of a conventional incandescent lamp is 10 to 30 lm/watt, it is advantageously more than twice that in the case of LED lamps, namely 60 to 100 lm/watt.

EP 2 138 761 A1 states that reflectors, particularly coated reflectors, consisting of aluminium can be used to achieve comparatively high illumination intensities or luminous efficacies $\eta_v$—i.e. high efficiencies. The total reflectance of a highly reflective carrier used as reflector also leads to a high luminous efficacy. The application is based on the same understanding of the term "highly reflective" as elucidated in the cited EP 2 138 761 A1. This means that "highly reflective" materials are understood hereinafter to mean those which, according to DIN 5036, Part 3 (11/79 edition), have a total reflectance of at least 85%, preferably of at least 90%, more preferably of at least 95%.

However, when aluminium is used as base material (carrier) for leadframes, it is found to be problematic to bond the gold wires to the aluminium since, over the course of the lifetime of the optoelectronic component, such as that of a diode chip, where temperatures exceeding 150° C. occur, various intermetallic gold-aluminium compounds can form, such as $Au_4Al$, $Au_5Al_2$ ("white plaque") and AuAl, and also the purple-coloured $AuAl_2$ ("purple plaque"), which do not cope with the thermal stresses in the application. Since these intermetallic compounds have higher specific electrical resistivity, contact resistance also increases with phase growth. In addition, the intermetallic compound $AuAl_2$ is comparatively brittle, and so the contacts can break relatively easily under mechanical stress. Therefore, "purple plaque" leads to a considerable deterioration in the reliability of semiconductor components or integrated circuits.

The problem addressed by the present invention is that of providing an optoelectronic device of the type described at the outset having high reflectivity and preferably also high long-term stability, i.e. having a small loss in total light reflectance over a long period of time, wherein, with employment of the chip-and-wire technique, high electrical connectability of the wire that creates electrical contact of the surface-mountable electronic component with the leadframe is achieved. The scope of the invention is also to provide a highly reflective composite material usable with preference for the leadframe.

SUMMARY AND INTRODUCTORY DESCRIPTION OF PREFERRED EMBODIMENTS OF THE INVENTION

The above-described problem is solved in accordance with the invention in respect of an optoelectronic device of the type described at the outset in that the leadframe comprises a metallic material having an aluminium carrier, on the surface of which a metallic joining layer not consisting of aluminium has been applied locally at the site of bonding to the wire.

The metallic joining layer may preferably consist of silver. This metal in particular, when it is bonded to gold wires, does not form any intermetallic phases. However, there are also other conceivable combinations of metals between which no damaging intermetallic phases form.

The application method used for the metal joining layer may especially be a cold gas spraying method, with which it is advantageously possible to provide a very small area, i.e. an area having an equivalent diameter in the range from 10 μm to 100 μm, especially in the range from 20 μm to 60 μm, with a metal layer of a few micrometres in thickness, especially 0.5 μm to 5.0 μm, preferably 1.0 μm to 3.0 μm. The joining layer may, for example, preferably also be executed in a rectangular manner in top view with edge lengths in the range from 10 μm to 200 μm, preferably in the range from 30 μm to 100 μm. The area may thus have an oval or circular shape in top view or else be in polygonal form. It serves as application area for the ultrasound weld bonding to the wire, especially to a gold wire.

It is important here that cold gas spraying is a "positive" material application method, meaning that the material of the joining layer can be applied with high precision only at the site where it is indeed required. This contrasts with the "negative" methods known from printed circuit board production, for example, where material is subsequently removed from an initially integrally, e.g. electrolytically coated surface. These "negative" methods are disadvantageously of higher technical complexity, entail greater material use and are also less precise. Application methods for the joining layer that are conceivable in principle with use of masks or screenprinting also seem unsuitable owing to insufficient accuracy.

Instead, similarly to the case of a friction welding process, cold gas spraying gives rise to a cohesive bond between the metal of the joining layer and the aluminium of the leadframe, wherein layers present atop the aluminium carrier are penetrated by the particles used in cold gas spraying. The particles hit the surface of the leadframe with such high energy that they advantageously penetrate any PVD layers present and any eloxal layer present and enter into a direct material bond with the aluminium. This means an electrical contact resistance of virtually zero.

Cold gas spraying is a coating method that has been known since the 1980s, for example for application of copper coatings to cooling bodies in power electronics or for application of coatings for induction heating of lightweight metal cookware, in which the coating material in powder form is applied to a carrier material at very high velocity. For details, reference is made by way of example to DE 10126100 A1. A process gas heated to a few hundred degrees, especially nitrogen or helium, is accelerated to supersonic velocity by expansion in a Laval nozzle, and then the powder particles are injected into the gas jet. The spray particles injected are accelerated to such a high speed (especially exceeding 1000 m/s at a pressure of up to 40 bar) that, by contrast with other thermal spraying methods, they form a dense and firmly adhering layer on impact on the substrate even without prior partial or full melting. Since the kinetic energy at the time of impact is insufficient for complete melting of the particles, the method, even though it is not executed at room temperature or lower by contrast with the thermal spraying methods that are practiced at higher temperatures, such as high-velocity flame spray (HVOF) is referred to as cold gas spraying. Given high spray efficiency and low spraying losses, the result is thus advantageously virtually pore-free, comparatively dense and low-oxide layers or material composites, and hence also higher thermal and electrical conductivity across the joining site. Likewise advantageously, given formation of stable phases and material compositions, there is only very minor introduction of heat into the carrier. Thus, the oxygen content in the joining layer according to the invention may, for example, be less than 0.5 percent by weight, preferably less than 0.1 percent by weight.

Metals used for cold gas spraying may, in accordance with the invention, for example, also be titanium, nickel, copper, tantalum and niobium, with composite materials also being producible from these materials.

The wire which bonds the electronic component to the leadframe consists of metal, preferably of a precious metal such as gold, silver or platinum, or copper, aluminium or alloys or material combinations of said metals. The wire may also have a superficial coating of gold, silver, platinum, copper or aluminium or alloys of these metals. For example, it may be a gold wire coated with aluminium.

The highly reflective carrier material used for the leadframe of the optoelectronic device according to the invention may be rolled aluminium having a minimum purity of 99.8%, atop which an interlayer is applied as a basis for overlying PVD layers and as a chemical, anticorrosive protection layer. This protective interlayer preferably forms in a wet-chemical eloxation process, which achieves sufficiently low surface roughness and sufficient surface hardness, and also freedom from surface defects, it being possible to very substantially seal any pores still present in the aluminium oxide layer by hot compression in the last phase of the process chain. By altering the purity and/or roughness, it is possible to influence the level of total reflection, while specific alterations in the rolled structure of the aluminium carrier can affect a degree of diffuse reflection. If the aluminium carrier material, especially in strip form, is introduced into the bath for anodic oxidation or for wet-chemical eloxation to produce the interlayer, there is formation both of the aluminium oxide interlayer on the top side thereof and of a further aluminium oxide layer with essentially the same structure on the underside thereof.

The optically active multilayer system which is then subsequently applied atop the interlayer may consist, for example, of at least three layers, where the upper layers are dielectric and/or oxidic layers, and the lowermost layer is a metallic layer which forms a reflection layer. In this case, the metallic layer may, for example, be a highly reflective ultrapure silver layer deposited atop the eloxal layer. It is optically dense and has extremely high total reflection within the visible range of light. Such a composite material of the type specified at the outset has found widespread use in the form of surface-upgraded aluminium strip under the MIRO®-Silver name for lighting technology, daylight systems and decorative applications.

Further composite materials having silver reflection layers that are usable for the leadframe of the optoelectronic device according to the invention are described in DE 10 2015 114 095 A1 and in WO 2017/032809 A1.

A reflective composite material having a carrier consisting of aluminium, with preferred suitability for the optoelectronic device according to the invention, to which independent inventive significance is attributed, has an interlayer composed of aluminium oxide on one side of the carrier and a reflection-boosting optically active multilayer system that has been applied to the interlayer, wherein the composite material is characterized in that the interlayer consisting of aluminium oxide has a thickness in the range from 5 nm to 200 nm and in that, on the opposite side of the carrier from the reflection-boosting optically active multilayer system, a superficial layer of a metal or a metal alloy which has a specific electrical resistivity at 25° C. of not more than $1.2*10^{-1}$ $\Omega mm^2/m$ has been applied, where the thickness of the superficially applied layer is in the range from 10 nm to 5.0 µm.

Such a composite material according to the invention, given high reflectivity and preferably also high long-term stability, i.e. having a small loss in total light reflectance over a long period of time, when employed in surface mounting, especially in the case of employment of the chip-and-wire technique, has improved electrical connectability to a printed circuit board (PCB). For instance, the material can be soldered onto the PCB with extremely low electrical contact resistance or be applied by means of a similar cohesive bonding method, for example using an electrically conductive lacquer or else adhesive.

Thus, advantageously, in the context of what is called wire bonding, the invention firstly enables problem-free welding of a wire, especially the ultrasound welding of a gold wire, on the front or top side of the composite material according to the invention to establish a connection between the surface of the composite material and an electronic component applied atop the composite material by surface mounting, and, secondly, the electrical contact resistance on the reverse side or underside of the composite material according to the invention is surprisingly found to be negligibly small.

The selection of the material and the thickness of the layer of a metal or metal alloy applied superficially on the reverse side can advantageously be optimized to one another in a wide variety of different aspects, for example the value of the specific electrical resistivity, thermal stability, especially on soldering, solder compatibility, availability, cost etc.

Preferably, from these aspects, the superficially applied layer of a metal or metal alloy may be a copper layer having a thickness in the range from 0.1 µm to 5.0 µm or a silver layer having a thickness in the range from 10 nm to 500 nm.

A light-emitting device according to the invention especially comprises the reflective composite material according to the invention, which forms the leadframe for an electronic component, such as a light-emitting diode in the form of a bare chip (die), wherein the electronic component lies on and is secured to the top side of the leadframe and is electrically contacted to the leadframe by means of a separate wire, and wherein the composite composed of the electronic surface-mounted device (SMD) and the leadframe is cohesively bonded on the underside in an electrically conductive manner to a printed circuit board (PCB).

The effect of the replacement of the customary frame structure consisting of silver-plated copper with the composite material according to the invention, especially when no silver is present in the superficially applied layer, is an elevated corrosion resistance, especially with respect to hydrogen sulfide, with a simultaneous increase in the luminous efficiency in any case, in that it can especially assume values well above 100 lm/W.

Further advantageous executions of the invention are described in the detailed description which follows.

BRIEF DESCRIPTION OF THE DRAWINGS

The invention is elucidated in detail by a working example illustrated by the appended drawing. The figures show.

DETAILED DESCRIPTION

With regard to the description which follows, it is emphasized explicitly that the invention is not limited to the working example, nor is it limited to all or multiple features of combinations of features that are described. Instead, every single component feature of the working example can also have inventive significance in isolation from all other component features described in connection therewith, on its own and also in combination with any other suitable features.

In the various figures of the drawing, the same parts are also always given the same reference numerals, and so they are generally also each described only once.

Figure 1:
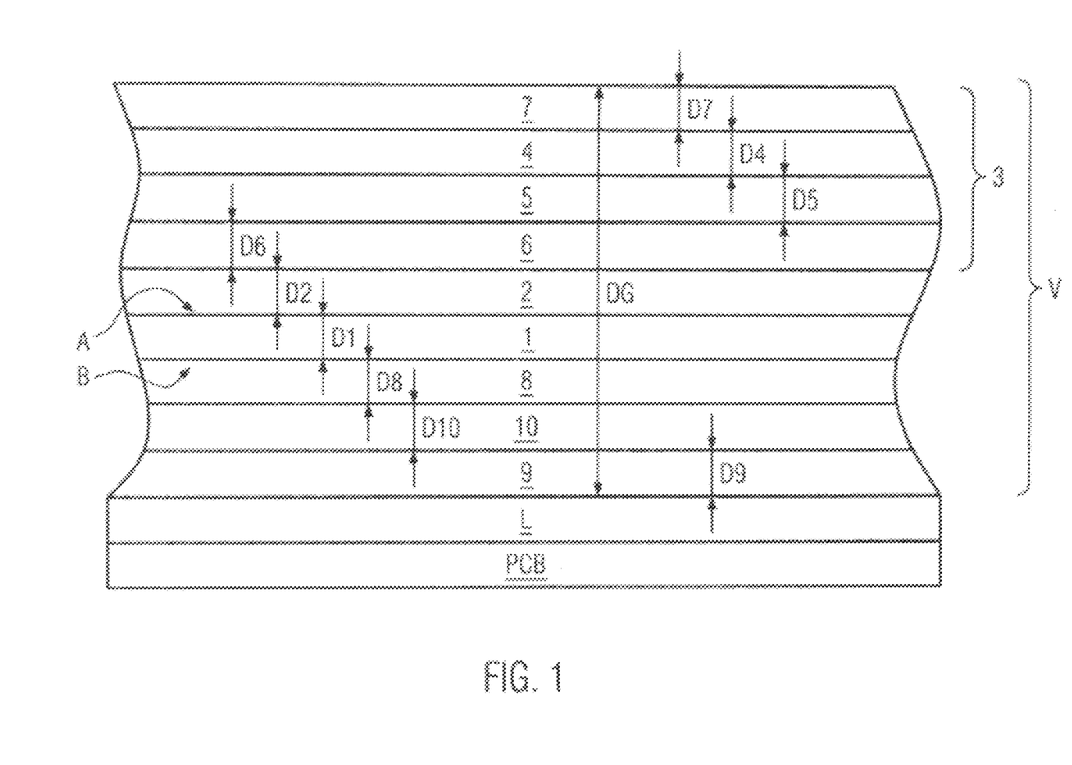
FIG. 1 is an enlarged basic section diagram through one embodiment of a composite material according to the invention, wherein the layer thicknesses are shown purely schematically and not to scale.

As apparent from FIG. 1, first of all, a reflective composite material V according to the invention has a carrier 1 consisting of aluminium, an interlayer 2 of aluminium oxide present atop the carrier 1 on a side A, and a reflection-boosting optically active multilayer system 3 applied to the interlayer 2. The carrier 1 may take the form of a coil having a width of up to 1600 mm, preferably of 1250 mm, and having a thickness $D_1$ of about 0.1 to 1.5 mm, preferably of about 0.2 to 0.8 mm. Since all thin layers present atop the carrier, especially the interlayer 2 and that of the optically active multilayer system 3, are negligibly small by comparison, the carrier thickness $D_1$, in terms of its size, is simultaneously also representative of a total thickness DG of the composite material V according to the invention.

The aluminium in the carrier 1 may especially have a higher purity than 99.0%, which promotes its thermal conductivity. This can prevent the formation of thermal peaks. For example, the carrier 1 may alternatively be an Al 98.3 aluminium sheet in strip form, i.e. with a purity of 98.3 percent. It is also possible to use aluminium alloys, for example an AlMg alloy, as carrier 1, especially in that the interlayer 2 can be formed therefrom by anodic oxidation.

The optically active multilayer system 3 may, for example, as shown, consist of at least three layers, of which two upper layers 4, 5 are dielectric and/or oxidic layers, and the lowermost layer 6 beneath is a metallic layer, for example one consisting of aluminium or silver, which forms a reflection layer 6.

Additionally shown in the case presented is an optionally present protective nonmetallic outer layer 7 consisting of a low-absorption material, for example silicon dioxide. Such a layer structure is known from German utility model DE 2 98 12 559 U1, to which reference is made in full in this connection. For instance, the dielectric and/or oxidic layers 4, 5 of the optical multilayer system 3 may each have a thickness $D_4$, $D_5$, for example, in the range from 30 nm to 200 nm, where this thickness $D_4$, $D_5$ in each case is preferably a quarter of the average wavelength of the spectral region of the electromagnetic radiation to be reflected, in order that the layers 4, 5 can act as reflection-elevating interference layers. The thickness $D_7$ of the protective layer 7 may be in the range from 0.5 nm to 20 nm, preferably in the range from 0.5 nm to 10 nm. It may also be the case that a protective silicon nitride layer has been applied as outer layer 7 to the optical multilayer system 3.

The optical multilayer system 3, including the outer layer 7 and advantageously also the layer 9 of a metal or metal alloy described hereinafter, especially in the form of a copper layer can be applied in a technologically advantageous manner using a continuous vacuum belt coating process. More particularly, layers 4, 5, 6, 7, 9 may be sputtered layers, especially layers produced by reactive sputtering, CVD or PECVD layers, or layers produced by evaporation, especially by electron bombardment or from thermal sources.

The reflection layer 6 may optionally be attached to the interlayer 2 via an adhesion promoter layer (not shown) consisting, for example, of aluminium oxide, titanium oxide and/or chromium oxide. In addition, the reflection layer 6 may optionally be embedded on the top side and underside between barrier layers (not shown), for example composed of nickel, nickel alloys or palladium, in order to increase the thermal stability.

The upper dielectric and/or oxidic layer 4 of the optical multilayer system 3 is a layer with a higher refraction index than the lower dielectric and/or oxidic layer 5 of the optical multilayer system 3, where the upper layer 4 may preferably consist of $TiO_2$, $Ta_2O_5$, $Nb_2O_5$, $MoO_3$ and/or $ZrO_2$, and the lower layer 5 preferably of $Al_2O_3$ and/or $SiO_2$.

Figure 2:
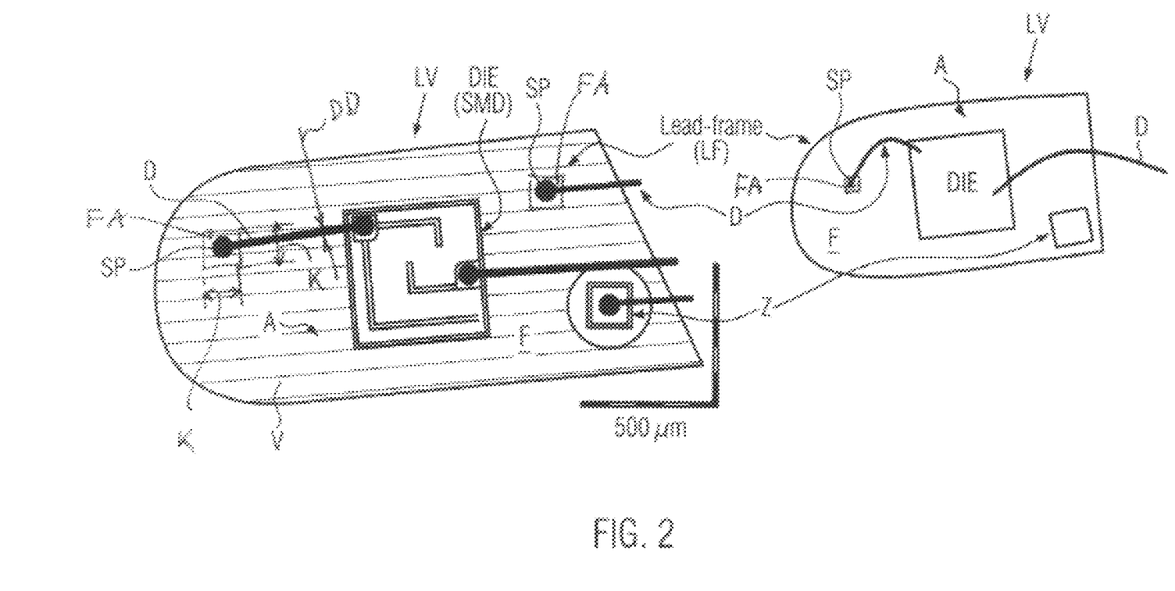
FIG. 2 is a top view of a subregion of one embodiment of a light-emitting device as an example of an optoelectronic device according to the invention.

According to the invention, the interlayer 2 consisting of aluminium oxide and especially formed from anodically oxidized aluminium has a thickness $D_2$ in the range from 5 nm to 200 nm, preferably in the range from 10 to 100 nm. As already stated, as shown in FIG. 2, advantageously in accordance with the invention, in the context of what is called wire bonding, firstly welding of a wire D, especially the ultrasound welding of a gold wire, on the front or top side A of the composite material V according to the invention is possible, such that an electrical connection (weld point SP) is possible without difficulty between the surface A of the composite material V and an electronic surface-mounted device SMD applied atop the composite material V by surface mounting.

It is preferable here that the surface of the interlayer 2 has an arithmetic mean roughness Ra in the range of less than 0.05 μm, especially of less than 0.01 μm, more preferably of less than 0.005 μm. In the presence of the aforementioned high total light reflectance, this serves to establish a minimum diffuse light reflectance determined according to DIN 5036. If a higher diffuse light reflectance is required, the roughness can be correspondingly increased.

On the opposite side B of the carrier 1 from the reflection-boosting optically active multilayer system 3, there is optionally a further layer 8 consisting of aluminium oxide, which can form simultaneously as a result of the preparation, for example in the course of eloxation of the top side A. However, if need be, the formation thereof can be avoided by coverage of side B. There are also known methods of removing layers of this kind if appropriate. If the further layer 8 consisting of aluminium oxide is present, the thickness D8 thereof should be within the same range as the thickness $D_2$ of the interlayer 2, i.e. within the range from 5 nm to 200 nm, preferably within the range from 10 to 100 nm.

A further feature essential to the invention is that, on the opposite side B of the carrier 1 from the reflection-boosting, optically active multilayer system 3, a superficial layer 9 of a metal or metal alloy which has a specific electrical resistivity at 25° C. of not more than $1.2*10^{-1}$ $\Omega mm^2/m$ has been applied, where the thickness $D_9$ of the superficially applied layer 9 is in the range from 10 nm to 5.0 μm.

More particularly, this may be a copper layer which has been applied with a thickness $D_9$ in the range from 0.1 μm to 5.0 μm, preferably in the range from 0.2 μm to 3.0 μm, more preferably in the range from 0.5 μm to 1.5 μm.

In another preferred embodiment of the invention, the superficially applied layer 9 is a silver layer having a thickness $D_9$ in the range from 10 nm to 500 nm, especially having a thickness $D_9$ in the range from 50 nm to 250 nm.

The specific electrical resistivity of the superficially applied layer 9 of a metal or metal alloy may preferably have a maximum value at 25° C. of $2.7*10^{-2}$ $\Omega mm^2/m$, more preferably a maximum value of $1.8*10^{-2}$ $\Omega mm^2/m$.

With regard to the values for the specific electrical resistivity which forms the basis for various materials, reference is made to Table 1 below, which is compiled on the basis of values cited in various places in the literature.

TABLE 1

Values of specific electrical resistivity ρ at 25° C.

| MATERIAL | ρ in $10^{-2}$ Ω mm²/m |
|---|---|
| ρ ≤ $1.8 * 10^{-2}$ Ω mm²/m particularly preferred in accordance with the invention | |
| Ag | 1.59 |
| Cu | 1.69-1.72 |
| ρ ≤ $2.7 * 10^{-2}$ Ω mm²/m preferred in accordance with the invention | |
| Al | 2.65 |
| Au | 2.21 |
| ρ ≤ $1.2 * 10^{-1}$ Ω mm²/m according to the invention | |
| W | 5.3 |
| Ni | 6.9-7.1 |
| Pt | 10.5 |
| Pd | 10.7 |
| Sn | 10.9 |

An overview of specific electrical resistivity p of ten different binary alloys (Al/Cu, Al/Mg, Cu/Au, Cu/Ni, Cu/Pd, Cu/Zn, Au/Pd, Au/Ag, Fe/Ni, Ag/Pd) each with different composition can be found, for example, in the scientific article "Electrical resistivity of ten selected binary alloy systems", author: Ho, C. Y. et al., in J. Phys. Chem. Ref Data, Vol. 12 No. 2, 1983, p. 183 to 322. On establishment of a particular chemical composition in the layer 9 envisaged in accordance with the invention, reference may be made to these values.

Alternatively, direct measurement is possible according to ASTM F390-11 "Standard Test Method for Sheet Resistance of Thin Metallic Films With a Collinear Four-Probe-Array". This standard also contains details of how a sheet resistance determined in the unit Ω or "Ω square" can be converted to a specific electrical resistivity taking account of the sheet geometry, i.e. the length, width and thickness thereof.

Between the carrier 1 consisting of aluminium or the further, optionally present layer 8 consisting of aluminium oxide and the copper layer 9, in a preferred form, an adhesion promoter layer 10 which consists, for example, of a transition metal, especially of titanium, chromium or nickel, and has a thickness $D_{10}$ which may preferably be in the range from 5 nm to 25 nm, more preferably in the range from 10 nm to 20 nm, may be provided.

As likewise already mentioned, the effect of this is advantageously that the electrical contact resistance on the reverse side or underside B of the composite material V according to the invention is negligibly small. Thus, this side B can be soldered onto a printed circuit board PCB or be applied by means of a similar cohesive bonding method. The cohesive bonding layer is identified by reference sign L in each of FIG. 1 and FIG. 4. Soldering can advantageously be accomplished using, for example, standard tin-containing electrical solders, for example Sn96.5Ag3Cu0.5.

In spite of a relatively thin surface layer 9 of the metal or metal alloy, especially a copper layer, it has been found that there is no formation of brittle intermetallic phases that are of high thickness relative to the layer thickness $D_9$ between the composite material V according to the invention and the solder, which could lead to mechanical, and as a result also to electrical, failure of the solder joint through thermal stresses. For instance, thermal storage for up to 1000 h led only to the formation of an intermetallic phase of a few hundreds of nm in thickness. It was also found that the solder bond of the bonding layer L advantageously passed typical tests in that a pull-off force or shear force between the connected LF, COB components was reduced only by less than a factor of 2 after thermal storage, for example at 120° C. for 1000 h.

Atop the superficially applied layer 9 of a metal or metal alloy, especially atop the copper layer, there may optionally be a passivation layer (not shown). This may preferably consist of Ag, Ni, Pd and/or Au (Ag/Ni/Pd/Au) and have a typical thickness in the range from 10 nm to 500 nm, preferably in the range from 50 nm to 250 nm. Owing to better wettability of the noble metal surface by the solder, such a layer also promotes the solderability of the finished SMD component to the PCB.

Figure 3:
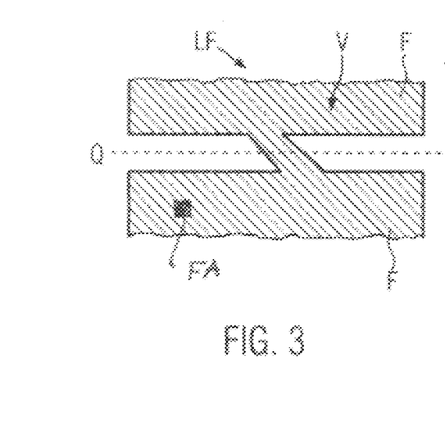
FIG. 3 is a top view of one embodiment of a leadframe formed from a composite material according to the invention for an optoelectronic, especially light-emitting, device according to the invention.
Figure 4:
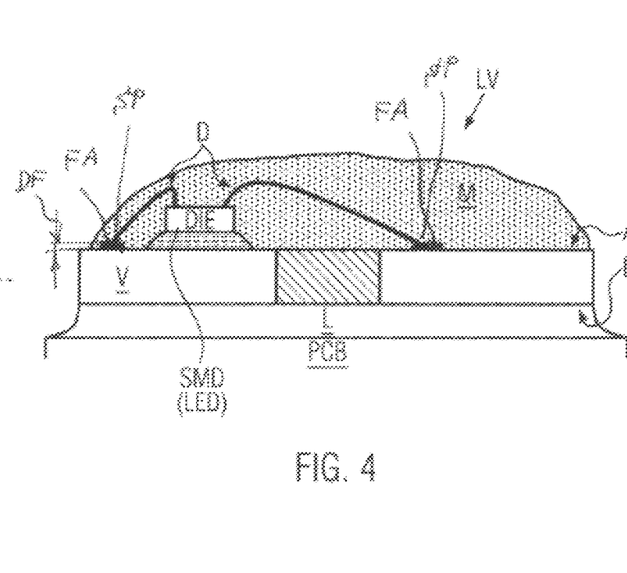
FIG. 4 is a cross section through one embodiment of a light-emitting device as an example of an optoelectronic device according to the invention.

A light-emitting device LV according to the invention, see FIG. 2 and FIG. 4, comprises the reflective composite material V according to the invention, which can form a leadframe LF for the electronic surface-mounted device SMD, such as a light-emitting diode in the form of a bare chip DIE. Such a leadframe LF is shown in FIG. 3. In the form shown, in top view, it has the shape of an H, with the crossbar Q thereof, between the tracks identified as fingers F, running not at right angles but, as shown, frequently obliquely. Such a leadframe LF can be manufactured in a technologically advantageous manner, for example, as a die-cut part or by laser cutting. If required, additional formation in the form of a bent part is also possible, since the composite material V can be bent without any problem and without loss of quality.

In this case, a multitude of leadframes LF can first be combined in a frame device in the form of a circuit board in strip form, in which the leadframes LF are incorporated in the form of fields, i.e. as line and column elements, via connectors. The leadframes LF can simply be removed from the frame device, for example broken out or die-cut, such that automated mass production in particular of light-emitting devices LV according to the invention is advantageously readily possible. The leadframes LF may already have been provided here with electronic chips SMD on the top side.

In the light-emitting device LV according to the invention, the electronic surface-mounted device SMD/DIE lies on the top side, i.e. on the side A, atop the leadframe LF, and has been electrically contacted with the leadframe LF by means of at least one separate wire D. As well as the LED-die (reference sign: DIE), FIG. 2 additionally shows, bottom right, a Zener diode Z as a further electronic surface-mounted device SMD. The composite composed of the electronic surface-mounted device SMD or, in the case shown, the two electronic surface-mounted devices SMD (DIE and Z) shown and the leadframe LF has been cohesively bonded in an electrically conductive manner to a printed circuit board PCB on the lower side (side B).

In a departure from the working example shown, it is also possible for other reflection-boosting systems 3 with further layers to be present atop the carrier 1. In this regard, particular mention should be made of the system of DE 10 2015 114 095 A1 with the reflection-boosting silver layer, if it is configured in accordance with the invention. By contrast, the system described in WO 2017/032809 A1 necessarily envisages the presence, in the interlayer 2, of an organic layer-forming lacquer of thickness of up to 5 μm, which should be avoided in accordance with the invention. According to the application, the wording "interlayer 2 of aluminium oxide" should preferably be considered to be conclusive in the sense of "consisting exclusively", but the existence of component layers in the interlayer 2 should possibly not be entirely ruled out in the application. However, in this aspect, the thickness $D_2$ of the overall interlayer 2 should then in each case be in the range from 5 nm to 200 nm.

Although the optical multilayer system 3 cannot only have the above-described layers 4, 5, 6, however, it must not be the case in accordance with the invention that an organic or organosilicon lacquer layer, for example based on a sol-gel layer as likewise described in the prior art, is applied thereon as outer layer 7.

It is apparent especially from FIGS. 2 to 4, which show the optoelectronic device LV, especially the light-emitting optoelectronic device LV, according to the invention and the detail thereof that, atop the surface of the optoelectronic device LV, locally at the weld point SP, i.e. at the site of connection to the wire D, a metallic joining layer FA not consisting of aluminium has been applied in accordance with the invention to the leadframe LF. This metallic joining layer FA may preferably consist of silver and, in top view, may have a circular shape or else be polygonal, especially rectangular, covering an area having a diameter or equivalent diameter or having edge lengths K (see FIG. 2) in the range from 10 µm to 100 µm, especially in the range from 20 µm to 40 µm. The metallic joining layer FA may have a thickness DF in the range from 0.5 µm to 5.0 µm, preferably in the range from 1.0 µm to 3.0 µm. The joining layer FA may have been applied by cold gas welding, where the oxygen content in the joining layer FA is especially less than 0.5 percent by weight, preferably less than 0.1 percent by weight.

The wire D may, as already mentioned, consist of metal, especially of gold, silver, copper, platinum or aluminium, or of alloys and material combinations of these metals, and/or else have a superficial coating of gold, silver, copper, platinum or aluminium or alloys of these metals. It may preferably have a diameter DD in the range from 15 µm to 35 µm and has preferably been cohesively bonded to the leadframe LF by means of ultrasound welding at the site of the joining layer FA.

Within the scope of the claims, the person skilled in the art will be able to envisage further appropriate modifications of the invention without leaving the scope of the invention. For example, in FIG. 4, the surface of the light-emitting device LV according to the invention has been encapsulated with a transparent mass M, for example with an epoxy resin. Alternatively or additionally, it would also be possible to provide optical lens systems above the electronic surface-mounted device SMD in the form of the LED chip DIE.

Where a silver layer is discussed above, especially as a reflection layer 6, this includes the possibility that such a layer can contain alloy elements within the range from 0.001 percent by mass to 5.0 percent by mass, especially within the range from 0.5 percent by mass to 3.0 percent by mass. The alloy elements may, for example, be a rare earth element, such as neodymium. Elements of this kind may migrate, for example, to the particle boundaries of the silver and/or accumulate at the surface of the silver layer, such that they are more likely to be oxidized there than the more noble silver and form a microscopically thin protective layer on the silver grains. The efficacy of these alloy elements can be enhanced further by additional inclusion in the alloy of palladium, platinum, gold and/or copper. This also brings about inhibition of diffusion and counteracts coalescence of silver crystallites, especially at high temperatures as can occur in the state of operation. This advantageously results in deceleration of the ageing of the reflection layer, i.e. a delay in the drop in reflectivity over time and/or with temperature.

Palladium can also be included in an alloy with the silver as a main alloy element, preferably in a proportion by mass within the range from 0.5 percent by mass to 3.0 percent by mass of the alloy, in which case, in a smaller proportion or at most the same proportion, one of the elements aluminium, gold, platinum, copper, tantalum, chromium, titanium, nickel, cobalt or silicon may additionally be present as the third alloy component.

Indium, titanium and/or tin may also be provided as alloy elements for the silver. In this regard, for example, a suitable alloy appears to be one that preferably contains indium and/or tin and/or else antimony and/or bismuth within the range from 0.5 percent by mass to 3.0 percent by mass, the remainder consisting of silver.

A suitable target for generating silver alloy layers in a sputtering process is also described in EP 3 196 334 A1.

While the above description constitutes the preferred embodiment of the present invention, it will be appreciated that the invention is susceptible to modification, variation and change without departing from the proper scope and fair meaning of the accompanying claims.

The invention claimed is:

1. An optoelectronic device, comprising, a leadframe for an electronic surface-mounted device, wherein the leadframe comprises a metallic material and wherein the electronic surface-mounted device lies and is mounted on a top side of the leadframe, and is electrically contacted to the leadframe by a wire, the leadframe comprises a metallic material having an aluminium carrier, on a surface of which a metallic joining layer not consisting of aluminium has been applied locally at a site of bonding to the wire;
   wherein a metal of the metallic joining layer penetrates one or more layers present on a surface of the leadframe, the one or more layers consisting of an optical multilayer system, or an interlayer having an aluminium oxide formed atop the carrier.

2. An optoelectronic device according to claim 1 further comprising, the metallic material of the leadframe is a reflective composite material and the electronic surface-mounted device is a light-emitting diode in the form of a chip.

3. An optoelectronic device according to claim 1 further comprising, the metallic joining layer consists of silver.

4. An optoelectronic device according to claim 1 further comprising, the metallic joining layer in a top view has a circular, a polygonal, or a rectangular form, covering an area having a diameter or an equivalent diameter or having edge lengths in the range from 10 µm to 200 µm.

5. An optoelectronic device according to claim 1 further comprising, the metallic joining layer has a thickness in the range from 0.5 µm to 5.0 µm.

6. An optoelectronic device according to claim 1 further comprising, the metallic joining layer is applied by a cold gas welding, where an oxygen content in the metallic joining layer is less than 0.5 per cent by weight.

7. An optoelectronic device according to claim 1 further comprising, a cohesive bond has been formed between a metal of the metallic joining layer and the aluminium carrier of the leadframe.

8. An optoelectronic device according to claim 1 further comprising, the wire consists of a one or more metal in the form of gold, silver, copper, platinum or aluminium, or of alloys and material combinations of the one or more metals.

9. An optoelectronic device according to claim 1 further comprising, the wire has a surface coating composed of gold, silver, copper, platinum or aluminium or alloys of gold, silver, copper, platinum or aluminium.

10. An optoelectronic device according to claim 1 further comprising, the wire has a diameter in the range from 15 μm to 35 μm.

11. An optoelectronic device according to claim 1 further comprising, the wire at a site of the joining layer is bonded to the leadframe by ultrasound welding.

12. An optoelectronic device according to claim 1 further comprising, a composite composed of the electronic surface-mounted device and the leadframe on an underside of the leadframe is cohesively bonded in an electrically conductive manner to a printed circuit board.

13. An optoelectronic device according to claim 12 further comprising, the leadframe has been connected to the printed circuit board via a tin-containing solder layer.

14. An optoelectronic device according to claim 12 further comprising, the device is a light-emitting device the electronic surface-mounted device is a light-emitting diode in the form of a chip.

15. A reflective composite material adapted for use as a leadframe in an optoelectronic device according to claim 1 further comprising, an interlayer of aluminium oxide atop the carrier on one side and having a reflection-boosting optically active multilayer system that has been applied to the interlayer, the interlayer consisting of aluminium oxide having a thickness in the range from 5 nm to 200 nm and in that, on an opposite side of the carrier from the reflection-boosting optically active multilayer system, a superficial layer of a metal or a metal alloy having a specific electrical resistivity at 25° C. of not more than $1.2*10^{-1}$ Ωmm²/m has been applied, where the thickness of the superficially applied layer is in the range from 10 nm to 5.0 μm.

16. A composite material according to claim 15 further comprising, the superficial layer of a metal or metal alloy that has been superficially applied on the opposite side of the carrier from the reflection-boosting optically active multilayer system has a specific electrical resistivity at 25° C. of not more than $2.7*10^{-2}$ Ωmm²/m.

17. A composite material according to claim 15 further comprising, the interlayer consisting of aluminium oxide having a thickness in the range from 10 to 100 nm.

18. A composite material according to claim 15 further comprising, an adhesion promoter layer of a transition metal, formed of one or more of titanium, chromium or nickel, is disposed between the aluminium carrier and the superficially applied layer of a metal or metal alloy.

19. A composite material according to claim 15 further comprising, the superficially applied layer of a metal or metal alloy is a silver layer, having a thickness in the range from 10 nm to 500 nm.

20. A composite material according to claim 15 further comprising, a passivation layer which consists of one or more of Ag, Ni, Pd and Au and having a thickness in the range from 10 nm to 500 nm, is deposited atop the superficially applied layer of a metal or metal alloy.

21. A composite material according to claim 15 further comprising, a silver layer as the superficially applied layer or as a passivation layer present thereon or as a reflection layer of the reflection-boosting optically active multilayer system is in the form of an alloy and comprises, one or more rare earth elements including one or more of palladium, platinum, gold, copper, indium, titanium, tin and molybdenum.

22. A composite material according to claim 15 further comprising, one or more of the layers arranged atop the interlayer, and the superficially applied layer of a metal or metal alloy or the passivation layer are sputtered layers, produced by reactive sputtering, CVD layers or PECVD layers, or layers produced by evaporation, by electron bombardment or from thermal sources.

23. A composite material according to claim 15 further comprising, the aluminium in the carrier has a higher purity than 99.0%.

24. A composite material according to claim 15 further comprising, the carrier has a thickness of 0.1 to 1.5 mm.

25. A composite material according to claim 15 further comprising, a total light reflectance determined according to DIN 5036, Part 3 (11/79 edition) on the one side of the optical multilayer system is greater than 97%.

26. A composite material according to claim 15 further comprising, formation as a coil with a width of up to 1600 mm.

27. A composite material according to claim 15 further comprising, the leadframe for an electronic surface-mounted device is a light-emitting device, wherein the electronic surface-mounted device lies on and is secured to a top side of the leadframe and is electrically contacted to the leadframe by the wire via a metallic joining layer, and wherein the composite composed of the electronic surface-mounted device and the leadframe is cohesively bonded on an underside in an electrically conductive manner to a printed circuit board.

28. A composite material according to claim 15 further comprising, a formation as a leadframe for a surface-mounted device, wherein the leadframe in a top view has the shape of an H, a crossbar of which runs obliquely between tracks in the form of fingers, and wherein the leadframe has been manufactured as a stamped or bent part or by laser cutting.

29. A composite material according to claim 28 further comprising, formation as a frame device in the form of a circuit board in strip form, in which a multitude of the leadframes are combined in fields in the form of line and column elements via connectors.

* * * * *